United States Patent
Motika et al.

(10) Patent No.: US 11,105,853 B1
(45) Date of Patent: Aug. 31, 2021

(54) EMPIRICAL LBIST LATCH SWITCHING AND STATE PROBABILITY DETERMINATION

(71) Applicant: INTERNATIONAL BUSINESS MACHINES CORPORATION, Armonk, NY (US)

(72) Inventors: Franco Motika, Hopewell Junction, NY (US); Richard Frank Rizzolo, Red Hook, NY (US); Paul Jacob Logsdon, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/804,073

(22) Filed: Feb. 28, 2020

(51) Int. Cl.
*G01R 31/3185* (2006.01)
*G01R 31/3187* (2006.01)
*G01R 31/3181* (2006.01)
*G01R 31/3177* (2006.01)

(52) U.S. Cl.
CPC .... *G01R 31/318541* (2013.01); *G01R 31/3177* (2013.01); *G01R 31/3187* (2013.01); *G01R 31/31813* (2013.01); *G01R 31/318538* (2013.01); *G01R 31/318547* (2013.01)

(58) Field of Classification Search
CPC ........ G01R 31/318541; G01R 31/3177; G01R 31/318547; G01R 31/318538; G01R 31/31813; G01R 31/3187
See application file for complete search history.

(56) References Cited

U.S. PATENT DOCUMENTS

| 6,442,723 B1 | 8/2002 | Koprowski et al. |
| 6,996,760 B2 | 2/2006 | Dorsey |
| 7,055,077 B2 | 5/2006 | Kiryu et al. |
| (Continued) | | |

FOREIGN PATENT DOCUMENTS

| WO | 2007143220 A2 | 12/2007 |
| WO | 2007143220 A3 | 12/2007 |

OTHER PUBLICATIONS

K. I. Diamantaras and N. K. Jha, "A new transition count method for testing of logic circuits," in IEEE Transactions on Computer-Aided Design of Integrated Circuits and Systems, vol. 10, No. 3, pp. 407-410, Mar. 1991. (Year: 1991).*

(Continued)

*Primary Examiner* — Cynthia Britt
(74) *Attorney, Agent, or Firm* — Cantor Colburn LLP; Steven Chiu

(57) ABSTRACT

Examples described herein provide a computer-implemented method that includes initiating a logic built-in self-test (LBIST) of a device under test (DUT). The method further includes performing latch state counting using a multiple input signature register (MISR) of the DUT, the performing responsive to the MISR being in a counter mode. The method further includes performing a latch transition counting of latches of the DUT using the MISR of the DUT and a storage latch, the performing responsive to the MISR being in the counter mode. The method further includes performing a latch count comparison by comparing an output of the MISR responsive to the MISR being in the counter mode to an output of a count compare register, the output of the count compare register representing a desired MISR state.

19 Claims, 9 Drawing Sheets

(56) References Cited

U.S. PATENT DOCUMENTS

| | | | |
|---|---|---|---|
| 7,340,496 B2 | 3/2008 | Burdine et al. | |
| 7,475,311 B2 | 1/2009 | Kiryu | |
| 8,407,542 B2 | 3/2013 | Douskey et al. | |
| 8,839,063 B2 | 9/2014 | Parekhji et al. | |
| 8,843,797 B2 | 9/2014 | Motika et al. | |
| 9,229,055 B2 | 1/2016 | Narayanan et al. | |
| 9,952,283 B2 * | 4/2018 | Narayanan et al. | |
| 2011/0064178 A1 * | 3/2011 | Sweeney | H04L 1/205 |
| | | | 375/371 |
| 2014/0149814 A1 * | 5/2014 | Al-omari | G01R 31/318566 |
| | | | 714/727 |
| 2017/0074934 A1 * | 3/2017 | Bhamidipati | G01R 31/3177 |
| 2018/0210030 A1 | 7/2018 | Narayanan et al. | |
| 2019/0324083 A1 * | 10/2019 | Sul | G01R 31/318314 |

OTHER PUBLICATIONS

R. A. Haring et al. "Blue Gene/L compute chip: Control, test, and bring-up infrastructure", IBM J. Res. & Dev. vol. 49 No. 2/3 Mar./May 2005; 13 pages.

\* cited by examiner

EMPIRICAL LBIST LATCH SWITCHING AND STATE PROBABILITY DETERMINATION

BACKGROUND

The present invention generally relates to logic built-in self-tests, and more specifically, to an empirical logic built-in self-test latch switching and state probability determination.

An integrated circuit (IC) is an electronic circuit formed on a semiconducting material that performs functions using discrete electronic components. A built-in self-test (BIST) is a technique that enables an IC to test itself. Logic BIST (LBIST) is a type of built-in self-test in which hardware and/or software on the IC enables the IC to test its own structure and operation. An LBIST enables testing internal circuits of a device under test (DUT) within the IC that have no direct connections to external pins and thus are unreachable by external testing equipment. Some LBIST utilize a technique referred to as STUMPS, which is a self-test using multiple input signature registers (MISR)/parallel shift register sequence generation (SRSG).

SUMMARY

Embodiments of the present invention are directed to an empirical logic built-in self-test latch switching and state probability determination.

A non-limiting example method includes initiating a logic built-in self-test (LBIST) of a device under test (DUT). The method further includes performing latch state counting using a multiple input signature register (MISR) of the DUT, the performing responsive to the MISR being in a counter mode. The method further includes performing a latch transition counting of latches of the DUT using the MISR of the DUT and a storage latch, the performing responsive to the MISR being in the counter mode. The method further includes performing a latch count comparison by comparing an output of the MISR responsive to the MISR being in the counter mode to an output of a count compare register, the output of the count compare register representing a desired MISR state.

A non-limiting example method includes evaluating logic built-in self-test (LBIST) pattern effectiveness of an LBIST pattern based at least in part on one or more pattern factors. The method further includes determining whether the LBIST pattern meets the one or more pattern factors. The method further includes responsive to determining that the LBIST pattern does not meet at least one of the one or more pattern factors, modifying the LBIST pattern and performing a reevaluation of the modified LBIST pattern.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the scope of the invention. For instance, the actions can be performed in a differing order or actions can be added, deleted or modified. Also, the term "coupled" and variations thereof describe having a communications path between two elements and does not imply a direct connection between the elements with no intervening elements/connections between them. All of these variations are considered a part of the specification.

DETAILED DESCRIPTION

One or more embodiments of the present invention provide for empirical logic built-in self-test latch switching and state probability determination. According to one or more embodiments described herein, techniques for the evaluation of individual latch switching activity and logic state probability of a logic built-in self-test (LBIST) structure are provided. The concept is based on utilizing existing LBIST selective signature generation (SSG) diagnostic assist in conjunction with hardware enhancement functions to the LBIST structure and control engine.

Figure 1:
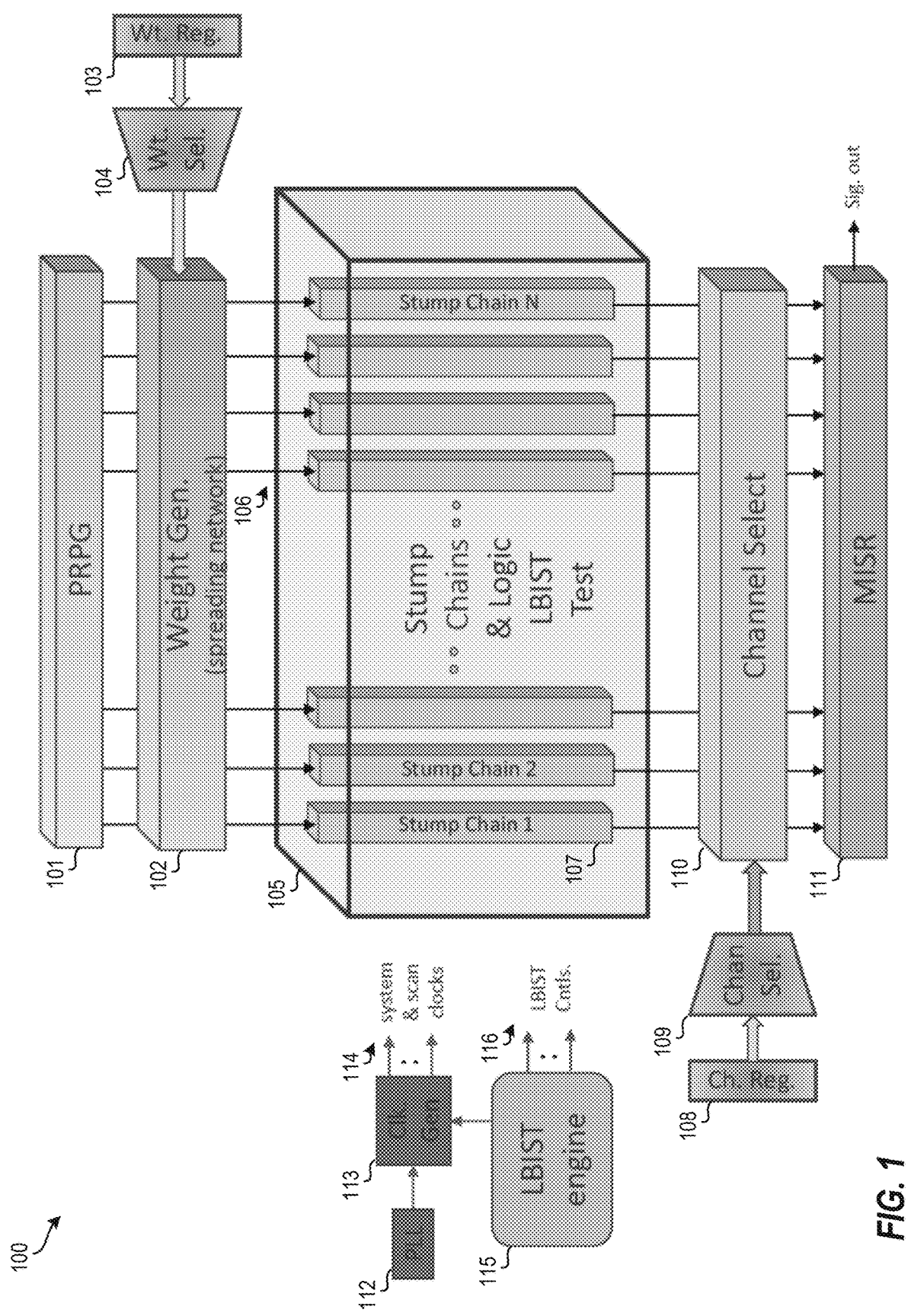
FIG. 1 depicts a functional block diagram of logic built-in self-test (LBIST) logic.

FIG. 1 depicts a block diagram of LBIST logic 100. A pseudo random pattern generator (PRPG) 101 (which could also include a linear feedback shift register (LFSR)) is provided. In an example, the PRPG 101 can have a 32-bit length with configured feedback taps to maximal length states (i.e. $2^n-1$ possible states). A weight generation logic 102 is provided, which modifies the stimulus to each chain of the stump chains 107. Each of the chains 107 represents one of the LBIST channels (e.g., one of 32 channels). The number of channels and the length of each channel can vary in different embodiments. These channels are formed by concatenating functional latches in a serial scan chain when used in LBIST test mode, and while in mission or system functional mode, the latches are clocked and loaded via a broadside port.

The weight generation logic 102 generates a set of selectable weights that are based on the pseudo-random probability, for example, of 1, 0, ½, ¾, ¼, ⅞, ⅛, etc. (0 or 1 state) for each PRPG latch. A spreading network can be utilized to minimize PRPG linear dependencies and to share PRPG output tapping resources. A weight selection setup register 103 is loaded prior to executing the LBIST test. Different weight selections can be loaded for multiple execution passes of the test.

A weight selection function 104 applies the register contents to select the same weight for all chains 107. According to one or more examples, although the weight selected for all channels is the same, the actual pseudo random bits shifted or applied to each individual channel are different.

A chain configuration STUMP channel structure 105 of chains 107, which can be 32 channels for example, includes system latches and combinational logic to be tested by the execution of multiple LBIST tester loops and test sequences. Although the chains depicted are shown of the same length, an actual configuration may have fewer or more chains of equal and/or unequal lengths. In examples, each chain can include many (e.g., 1000) latches.

Weighted pseudo random stream bits 106 are shifted or loaded concurrently into each chain 107 of the chain configuration STUMP channel structure 105 serially, one bit at the time. In examples, the loading shift process is repeated for the length of the longest channel until all latches in the structure are loaded. It should be appreciated that a similar unloading of all the selected channels occurs on the output end of the channel and the contents of all the latches are clocked into a multiple input signature register (MISR) 111 to generate the signature.

A channel selection setup register 108 is loaded prior to executing the LBIST test. Different channel selections can be loaded for multiple execution passes of the test. This is also referred to as a channel mask register. A channel mask selection function 109 applies the above register contents to mask or disable the scan output of the specific chains 107. A channel selection block 110 includes the implementation for each channel's masking logic specified by the channel selection setup register 108 and selection function 109.

The MISR 111 is a similar LFSR to the PRPG 101 with the addition of XORed inputs for each latch position. As shown, the output from each selected chain 107 feeds the corresponding input to the MISR 111. The MISR 111 compresses a large number of bits generated during the LBIST test into a signature (an MISR signature), which is then unloaded via a 'sig. out' function to be compared to an expected signature.

A phase lock loop (PLL) 112 is part of a system clock generation function and generates internal high-frequency functional clocks from externally supplied lower frequency reference clocks. The clock generator 113 represents the system's functional and test clocks generation from the PLL. The test clocks include support for LBIST clocking and associated scan clocks as the output 114 of the clock generator 113.

The LBIST engine 115 is a controller for the sequencing, loop control, clocking, and execution of the PRPG 101, the MISR 111, and channel scan and control of the test logic. The LBIST engine 115 or controller can support one or more channel structures concurrently. The LBIST engine 115 outputs LBIST controls 116 to the respective components of the LBIST configuration 100.

Figure 2:
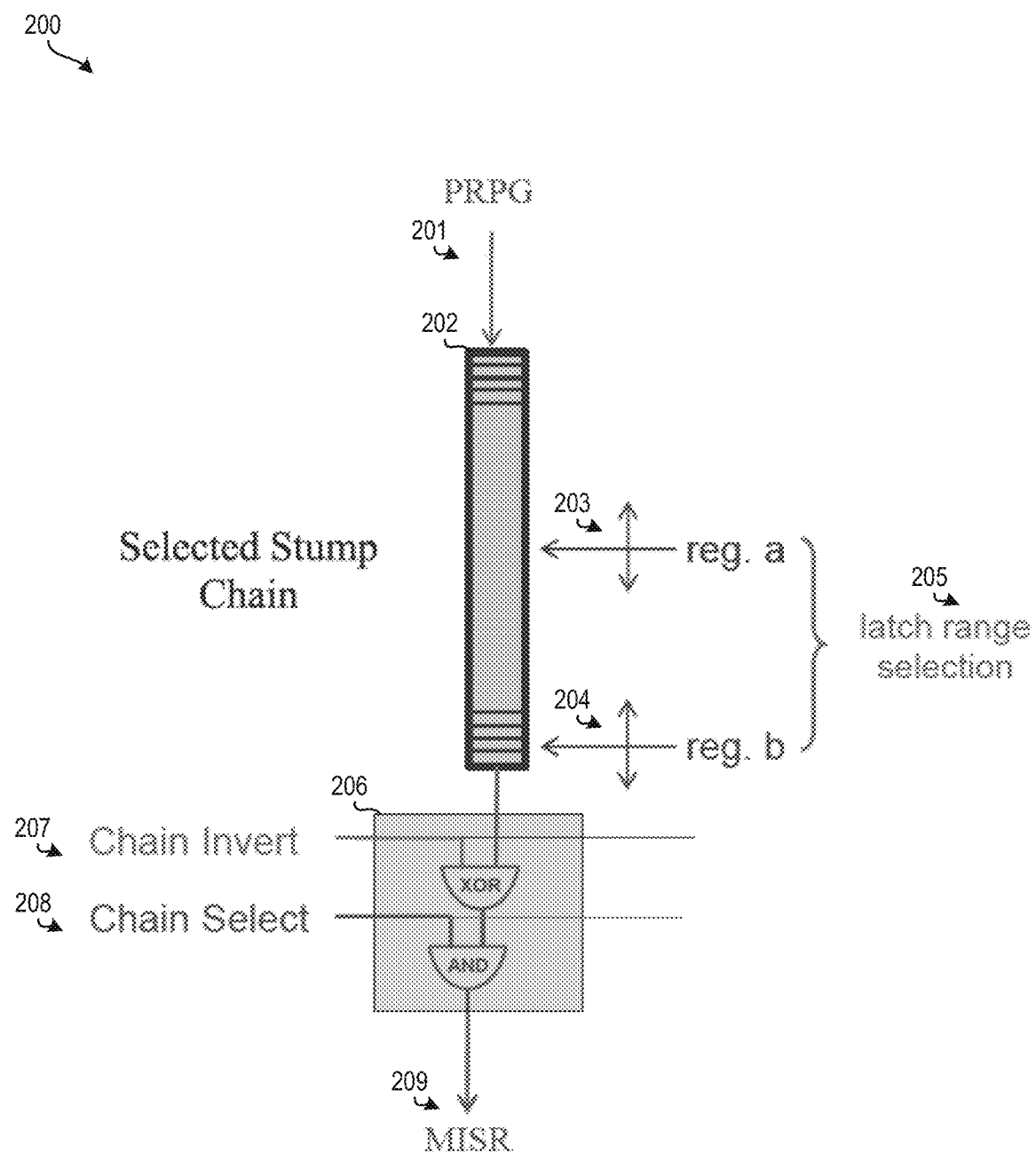
FIG. 2 depicts a block diagram of an overview of a STUMP scan chains channel slice selection arrangement for which a switching activity and corresponding logic state probability of individual latches in the self-test is observed for the LBIST logic of FIG. 1.

FIG. 2 depicts a block diagram of an overview of a STUMP scan chains channel slice selection arrangement 200 for which a switching activity and corresponding logic state probability of individual latches in the self-test is observed for the LBIST logic 100 of FIG. 1. In particular, FIG. 2 shows a slice of a STUMP channel configuration. The selective signature generation options to select a specific STUMP chain or channel, latch range (i.e., aperture range), and channel output inversion are described as follows.

The switching activity is provided by the PRPG 201. A PRPG output 201 is received from a PRPG (e.g., the PRPG 101 of FIG. 1). The PRPG output 201 includes a selected STUMP channel PRPG output feeding weighted pseudo-random data to the corresponding selected scan chain.

The selected STUMP scan channel by SSG channel select feature is shown as the selected stump chain 202. This is also referred to as the channel mask since it suppresses or masks channel scan-out data to the corresponding MISR input. In other words, if the channel is masked or deselected, the data into the MISR will be "0". Register 203 specifies the start of the latch selection range. Note that the register 203 can be set to the first latch of the scan chain. Register 204 specifies the end of the latch selection range. Similarly, register 204 can be set to the last register of the scan chain.

A latch range selection 205 (between the loaded values designated by the registers 203, 204) defines the range of latches that will be observed by the MISR (i.e., aperture range). In one example, the latch range selection 205 can encompass all the latches in the chain, while in another example, a single latch can be selected. An additional feature of the SSG is to complement the observable range (not shown in FIG. 2). In other words, all the latches outside the specified range will be observed by the MISR.

Logic 206, having an XOR gate and an AND gate configured and arranged as shown is associated with each channel to enable selection and inversion. The chain invert signal 207 from the SSG complements or inverts the output of individual scan channels. The chain select signal 208 from the SSG masks individual channels as described herein. The logic 206 outputs 209 the selected STUMP channel output feeding the MISR input from the the corresponding selected scan chain.

A problem often encountered when testing very large logic structures of a DUT, such as when using the LBIST test methodology with large weighted pseudo-random pattern sets, is to determine the switching activity and corresponding logic state probability of individual latches in the self-test using multiple input signature registers (MISR) and parallel shift register sequence generation (SRSG) (STUMP) scan chains.

Knowing the switching activity of individual latches and the corresponding logic state probability for a specific pattern is desirable when determining test coverage, optimizing LBIST weights selection, optimizing LBIST seed selection, and minimizing switching noise during test and burn-in stress (BI). An example of test coverage inadequacy could be quickly identified if the switching probability of either a logic-1 or a logic-0 state of any latch of the DUT is zero for the applied set of patterns. The problem with calculating the above switching and logic state probabilities for large designs having tens of millions of latches using software simulation and large sets of patterns requires long processing times on large computing systems.

To address these and other shortcomings of the prior art, the present techniques utilize a "good" reference device to execute LBIST pattern(s) and empirically determine the logic state probability and switching activity of each latch in the STUMP chains. The concept is further based on the LBIST SSG and minor design-for-test (DFT) support to gate MISR clocking. The SSG controls can be used to select individual STUMP channels and individual latches for the desired STUMP channel(s). This SSG control feature, also referred to as aperture mode, enables unloading the contents of one or more latches into the MISR for an entire LBIST pattern (see, e.g., FIGS. 1 and 2).

According to one or more embodiments described herein, a single latch at a time is selected for the entire LBIST test in order to determine that latch's switching activity. This is then repeated for each latch of interest in the STUMP structure. Multiple latch groups can also be selected using the SSG aperture option.

In addition to the SSG individual latch select option, the presently described techniques can use the existing MISR as a special counter. This is accomplished by gating the MISR clock with the state of the selected STUMP channel. The inversion option in the channel output further enables counting the number of 0-state or 1-state and switching activity in the selected latch (see, e.g., FIGS. 3 and 4 described more fully herein). In yet another example, the MISR count can be dynamically compared to a pre-specified count to determine the tester loop at which switching occurs. The output of the count comparator can also be used to exit a specific latch test (see, e.g., FIG. 6).

Figure 3:
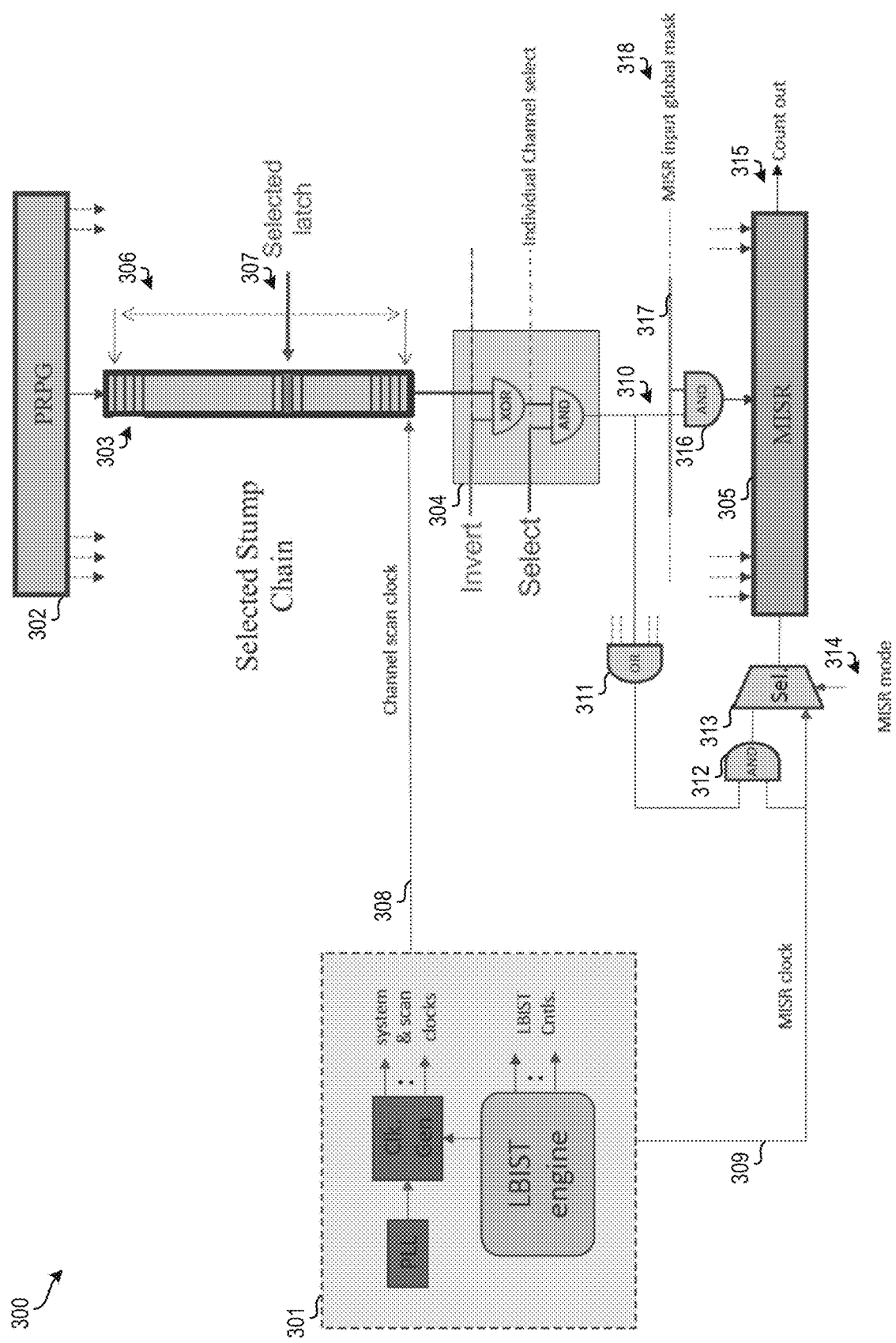
FIG. 3 depicts a block diagram of the MISR used as a latch state counter for an LBIST logic according to one or more embodiments described herein.

The present techniques provide for initiating a logic built-in self-test (LBIST) of a device under test (DUT), performing latch state counting using a multiple input signature register (MISR) of the DUT responsive to the MISR being in a counter mode, performing a latch transition counting using the MISR of the DUT and a storage latch, performing a latch count comparison by comparing an output of the MISR responsive to the MISR being in the counter mode to an output of a count compare register. The present techniques also provide for evaluating logic built-in self-test (LBIST) pattern effectiveness of an LBIST pattern based at least in part on one or more pattern factors, determining whether the LBIST pattern meets the one or more pattern factors, and, responsive to determining that the LBIST pattern does not meet at least one of the one or more pattern factors, modifying the LBIST pattern and performing a reevaluation of the modified LBIST pattern FIG. 3 depicts a block diagram of a latch state counter for an LBIST logic 300 according to one or more embodiments described herein. In particular, FIG. 3 provides an overview of channel slice selection for a STUMP configuration using SSG options with design for test changes to enable a latch state counter for the LBIST logic 100 of FIG. 1.

The latch state counter 300 includes an LBIST and clock functional block 301 that includes the LBIST engine, clocking, and SSG support aspects described with regards FIG. 1.

A PRPG 302 provides a selected STUMP channel PRPG output that feeds weighted pseudo-random data to the corresponding selected stump chain 303, as described with regards to FIGS. 1 and 2. The selected stump chain 303 includes a full range 306 for a selection of an individual latch to be observed. An instance of the actively selected latch 307 is also provided. The switching activity of every latch in the range 306 is determined by executing the full LBIST test per selected latch as described herein.

The output of the selected stump chain 303 is input into logic 304, having an XOR gate and an AND gate configured and arranged as shown and being associated with each channel to enable selection and inversion as described herein. It should be appreciated that by selecting the inversion option, one can count the "0" instead of the "1" states of the selected latch.

An MISR 305 is also provided, which is similar to the MISR 111 of FIG. 1. However, in this example, the MISR 305 can be used as a special counter, rather than a signature generator, when the corresponding mode is selected and the MISR 305 is initialized to a non-zero state.

The LBIST and clock functional block 301 sends a channel scan clock signal 308 to the selected stump chain 303. This is an LBIST engine generated channel scan and MISR clock signal. For each scan clock cycle, the STUMP chain shifts (load and unload) and the MISR 305 is clocked concurrently capturing the selected channel output data. In some examples, such as a normal LBIST mode, the MISR 305 is clocked on each cycle to generate a signature.

The LBIST and clock functional block 301 also sends a MISR clock signal 309 to the MISR 305 via the MISR clock selector 313. The MISR clock signal 309 is similar to the channel scan clock signal 308 but is enabled only during the selected latch range or aperture.

The output 310 of the logic 304 feeds the input of the MISR 305. The same output 310 from the selected channel is used to gate the MISR clock in the special counter mode (also referred to as a "counter mode" or "special mode"), which is the select line 314 to the MISR clock selector 313. Note that if the scan output is a "1" and the MISR counter mode is selected, the MISR 305 is closed and the MISR state is incremented. The OR gate 311 propagates the output 310, which is the output state of the selected scan chain, to the MISR clock gating logic, which includes the AND gate 312. Note that any other unselected channels propagate a "0." In some examples, a 32:1 selector can be used instead of the OR gate 311. The AND gate 312 only allows the MISR clock signal 309 to propagate to the MISR 305 when the selected scan out data is a "1." The MISR clock selector 313 (i.e., a multiplexer) allows either a normal signature generation mode or an alternate special counter mode, which is set by the LBIST engine of the LBIST and clock functional block 301. The MISR 305 outputs a count out 315 that contains the normal LBIST signature or the selected latch logic state count depending on the mode of the MISR 305. That is, the MISR 305 outputs the normal LBIST signature when the MISR 305 is operating in a standard/normal mode. However, when the MISR 305 is operating in the special mode, it outputs the selected latch logic state special LFSR shift count.

An MISR input global mask 318 is an additional LBIST control line used to disable MISR input data via a global signal 317 into an AND gate 316. The AND gate 316 sets the inputs to the MISR 305 to "0" when 318 is asserted. This in turn has the effect of changing the MISR 305 into a simple LFSR. When using the LFSR as a special counter, the initial MISR state is set to a non-zero state.

Figure 4:
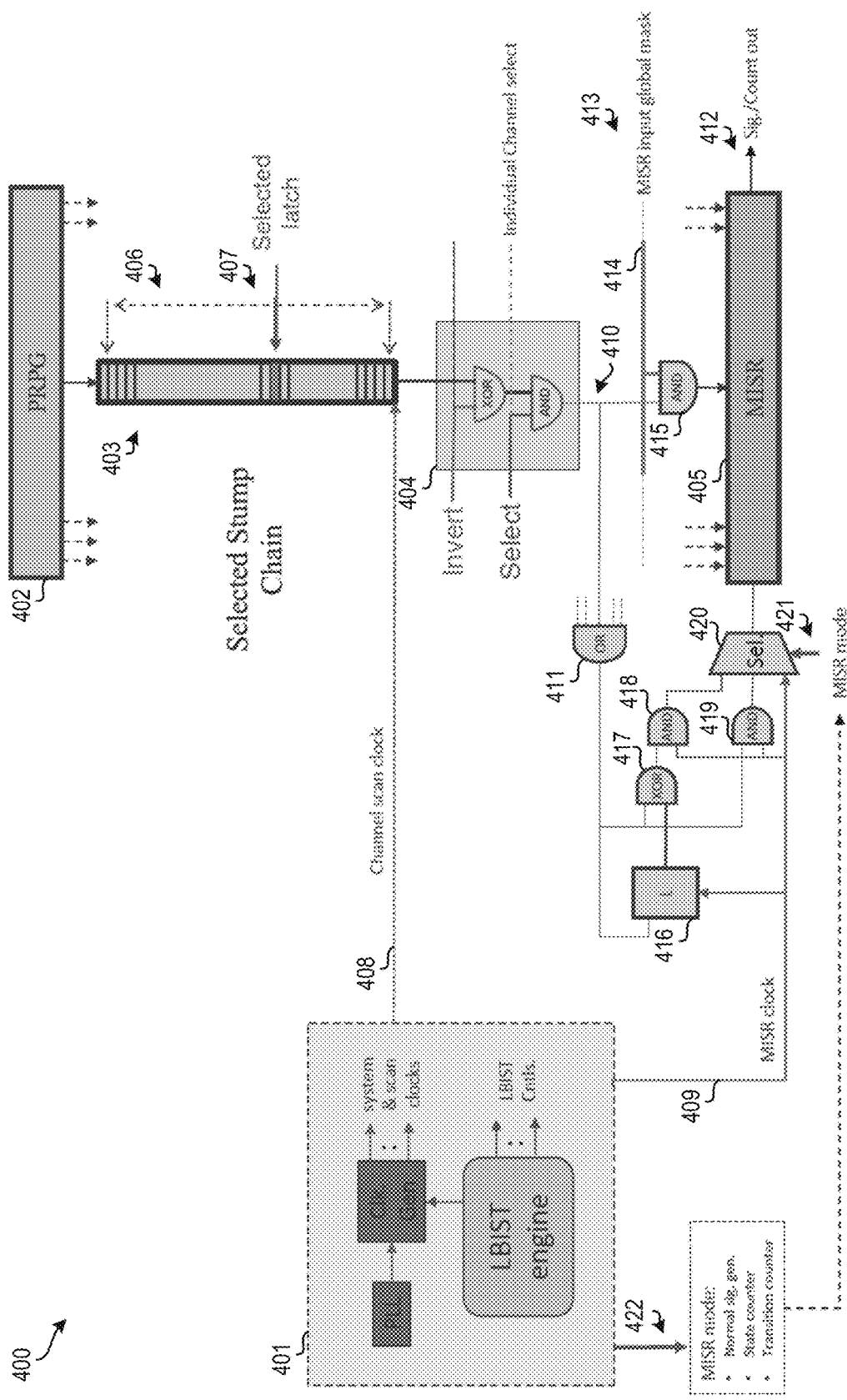
FIG. 4 depicts a block diagram of the MISR used as a latch selection and MISR latch state or transition counter for an LBIST logic according to one or more embodiments described herein.

FIG. 4 depicts a block diagram of latch selection and MISR latch state or transition counter for an LBIST logic 400 according to one or more embodiments described herein. FIG. 4 shows a slice of the STUMP channel configuration like FIG. 3 with an additional transition counter function. This embodiment provides a channel slice selection for a STUMP configuration using SSG options with DFT changes to enable the latch state and transition counter functions.

The LBIST logic 400 for latch selection and MISR latch state or transition counter includes an LBIST and clock functional block 401 that includes the LBIST engine, clocking, and SSG support aspects described with regards FIG. 1.

A PRPG 402 provides a selected STUMP channel PRPG output that feeds weighted pseudo-random data to the corresponding selected stump chain 403, as described with regards to FIGS. 1 and 2. The selected stump chain 403 includes a full range 406 for a selection of an individual latch to be observed. An instance of the actively selected latch 407 is also provided. The switching activity of every latch in the range 406 is determined by executing the full LBIST test per selected latch as described herein.

The output of the selected stump chain 403 is input into logic 404, having an XOR gate and an AND gate configured and arranged as shown and being associated with each channel to enable selection and inversion as described herein. It should be appreciated that by selecting the inversion option, one can count the "0" instead of the "1" states of the selected latch.

An MISR 405 is also provided, which is similar to the MISR 111 of FIG. 1. However, in this example, the MISR 405 can be used as a special counter, rather than a signature generator, when the corresponding mode is selected.

The LBIST and clock functional block 401 sends a channel scan clock signal 408 to the selected stump chain 403. This is an LBIST engine generated channel scan and MISR clock signal. For each scan clock cycle, the STUMP chain shifts (load and unload) and the MISR 405 is closed concurrently capturing the selected channel output data. In some examples, such as a normal LBIST mode, the MISR 405 is clocked on each cycle to generate a signature.

The output 410 of the logic 404 feeds the input of the MISR 405 via AND gate 415.

An MISR input global mask 413 is an additional LBIST control line used to disable MISR input data via a global signal 414 into an AND gate 415. The AND gate 415 sets the inputs to the MISR 405 to "0" when 413 is asserted. This in turn has the effect of changing the MISR 405 into a simple LFSR. When using the LFSR as a special counter, the initial MISR state is set to a non-zero state.

The LBIST and clock functional block 401 also sends a MISR clock signal 409 to the MISR 405 via the MISR clock selector 420. The MISR clock signal 409 is similar to the channel scan clock signal 408 but is enabled only during the selected latch range or aperture.

The output 410 of the logic 404 also feeds an OR gate 411, which in turn feeds the storage latch 416, an XOR gate 417, and an AND gate 419. The function of the storage latch 416 is to save the previous state of the selected latch to be compared to the current state of the selected latch. These two states can then be used to determine a transition event. For example, if the previous and current state of the latch are different, then a latch state transition is determined to have occurred.

The XOR gate 417 receives an output from the latch 416 and the output of the OR gate 411 and outputs a logical "true" for a transition event, which is fed into an AND gate 418. The AND gate 418 enables the MISR clock signal 409 to propagate to the MISR mode selector 420 for a transition occurrence.

An AND gate 419 only allows the MISR clock 409 to propagate to the MISR 405 when the selected scan out data is a logical "1" for latch state counting as described in FIG. 3. The MISR mode selector 420 propagates the corresponding MISR clock 409 to increment the MISR 405 to the next state or count based on the MISR mode selection control signal 421. The MISR mode selection control signal 421 is a 2-bit signal set by the LBIST engine. The MISR mode of operation 422 is selected depending on the LBIST test being executed. The MISR modes of operation 422 can include a normal signature generation mode, a selected latch state counter mode (i.e., counting "1"s or "0"s), and/or a selected latch transition counter mode (i.e., counting "1-to-0" transitions and "0-to-1" transitions) mode.

The MISR 405 outputs an MISR scan-out 412 for signature or 'special' LFSR state counter results unloading.

Figure 5:
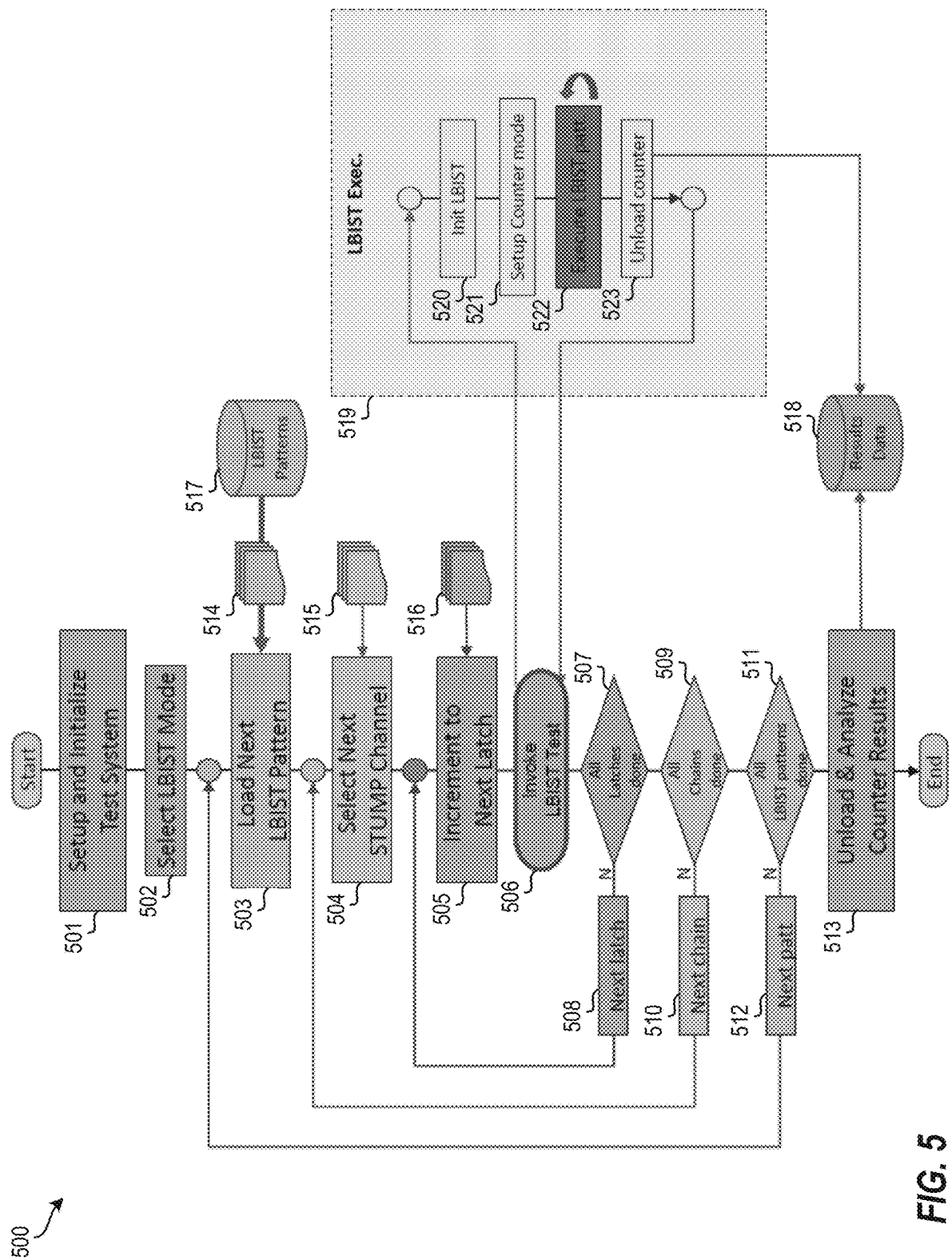
FIG. 5 depicts a flow diagram of a method for a latch switching and state probability evaluation process according to one or more embodiments described herein.

FIG. 5 depicts a flow diagram of a method 500 for a latch switching evaluation process according to one or more embodiments described herein. In particular, the method 500 provides for executing the LBIST test, performing a latch selection sequence, performing a channel selection sequence, and a pattern selection sequence.

The method 500 starts and continues to block 501, where a test system is setup and initialized. For example, a system is setup and initialize to enable DUT testing and execution of an LBIST test. This may include powering up the DUT, setting up clocking, and executing a preliminary DUT verification test to ensure a "good" reference device. At block 502, an LBIST mode is selected. This can include setup of the LBIST text execution parameters and SSG mode for state or transition counting. The test execution parameters are loaded (see blocks 514, 516 described in more detail herein) and control of the triple-loop selection is established.

At block 503, a next LBIST pattern is loaded. This is the initial setup for the LBIST pattern test, and subsequent incrementing of the heist order LBIST pattern execution loop occurs iteratively (see block 512 described in more detail herein). The pattern(s) are loaded with a list of parameters 514 from a database 517 of LBIST patterns. At block 504, a next STUMP channel is selected. This is the inner individual STUMP channel selection loop. The channels to be selected and the order of execution are specified by a list of parameters 515. At block 505, the method 500 increments to a next latch. This is the lowest latch selection loop. The latches to be selected and the order of execution are specified by a list of parameters 516.

At block 506, the LBIST test is invoked. That is, once all the SSG selections are complete, the execution of the LBIST test pass in invoked via test sequence 519. The test sequence 519 represents the execution steps in evaluating the switching activity of each individual latch. At block 520, the LBIST test engine is initialized for the specified number of tester loops. Further, PRPGs are set to the initial seed and configuration, and the MISRs are set to a non-zero initial seed and configuration. At block 521, a special counter mode is selected, which can be either latch logic state or transition activity counting. At block 522, the LBIST execution loop is started for the specified number of tester loops and continues until the LBIST execution is complete. At block 523, upon completion of the LBIST test, the MISR counter state is stored for future analysis. The method 500 then exits the test sequence 519 and continues back to block 506.

Once the LBIST pass is complete, a check is performed to determine if all latches in the list of parameters 516 have been evaluated for switching activity. In particular, it is then determined at decision block 507 whether all latches have been tested. If not, a next latch 508 is tested, and the method 500 returns to block 505. That is, if all the specified latches in the list of parameters 516 have not been evaluated, the next latch 508 is selected for switching evaluation. If it is determined at decision block 507 that all latches have been tested, the method 500 proceeds to decision block 509.

Once all the latches have been evaluated for the current STUMP chain, a check is performed to determine if all chains in the list of parameters 515 have been exercised. In particular, it is then determined at decision block 509 whether all chains have been tested. If not, a next chain 510 is tested, and the method 500 returns to block 504. That is, if all the specified STUMP chains in the list of parameters 515 have not exercised, the next chain is selected for switching evaluation. If it is determined at decision block 509 that all chains have been tested, the method 500 proceeds to decision block 511.

Once all the chains have been evaluated for the current LBIST pattern, a check is performed to determine whether all patterns in the list of parameters 514 have been exercised. In particular, it is determined at decision block 511 whether all LBIST patterns have been tested. If not, a next pattern 512 is tested, and the method 500 returns to block 503. That is, if all the specified LBIST patterns in the parameter list have not ben exercised, the next pattern from the list of parameters 514 is selected for switching evaluation. If it is determined at decision block 511 that all patterns have been tested, the method 500 proceeds to block 513.

At block 513, upon completion of the evaluation of all the execution parameters and patterns, the test results of all the counters is stored in a result database 518 for further statistical test coverage and statistical switching analysis. In some examples the database 517 and the database 518 are the same storage media, although they can be different storage media in another example. The method 500 then ends.

The list of parameters 514 is an LBIST pattern execution parameter list that specifies all the patterns to be evaluated and the sequence of their execution. Note that the list of parameters 514 may contain one or more patterns. The list of parameters 515 is a STUMP channel parameter list that specifies all the channels to be evaluated and the sequence of evaluation. Note that the list of parameters 515 may contain one or more channels in any order specified. The list of parameters 516 is a latch execution parameter list that specifies all the latches, in the currently selected STUMPS chain, to be evaluated and the sequence of execution. Note that the list of parameters 516 may include one or more latches. Latches that have been previously evaluated or are of no interest can be excluded from the list of parameters 516 in some examples.

Figure 6:
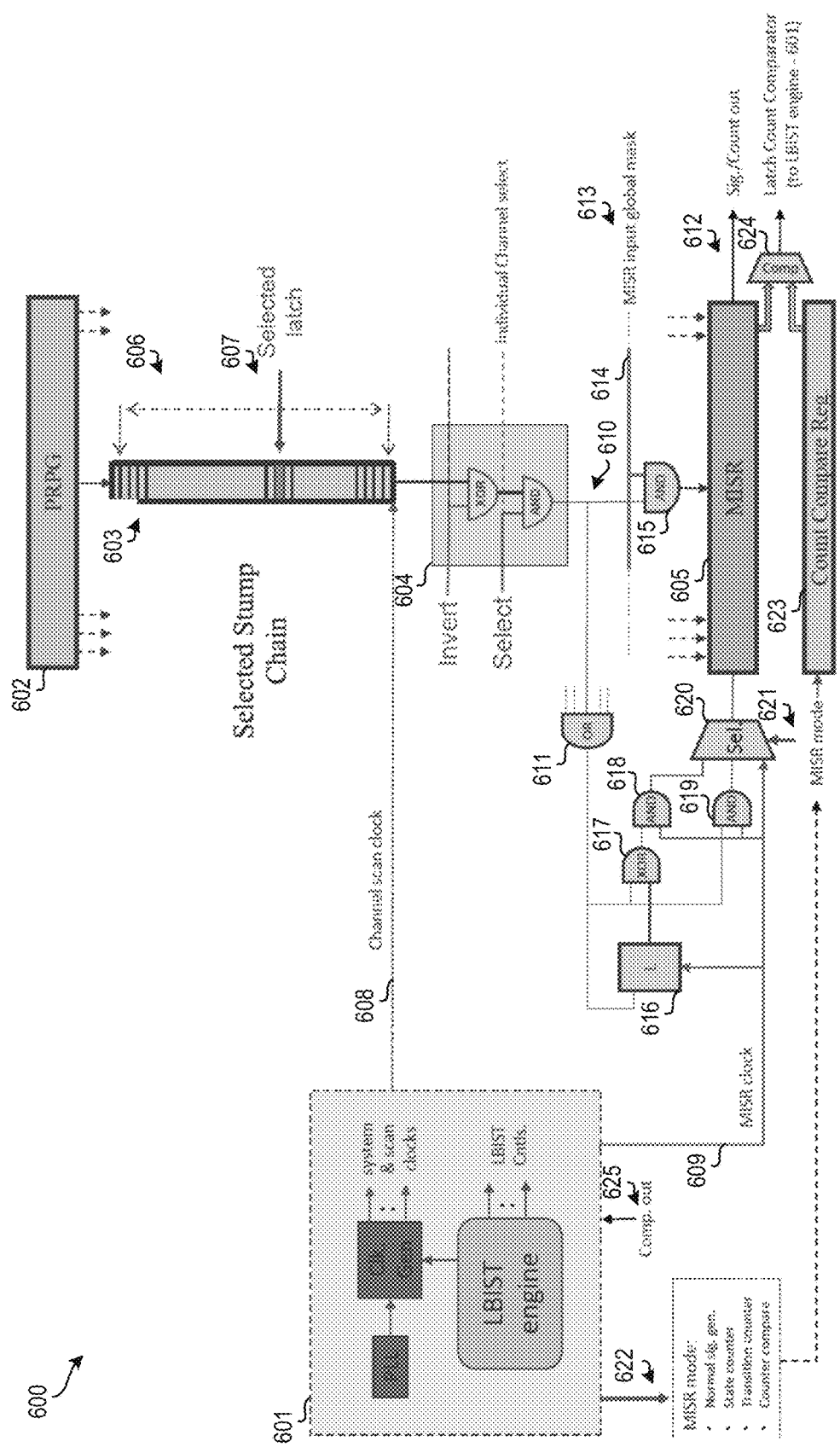
FIG. 6 depicts a latch count comparator of an LBIST logic according to one or more embodiments described herein.

FIG. 6 depicts a latch count comparator of an LBIST logic 600 according to one or more embodiments described herein. The ample LBIST logic 600 is similar to the LBIST logic 400 of FIG. 4 but additionally includes an MISR counter comparison feature that can be used to dynamically determine the tester loop at which the count condition is met and to alter the flow of the LBIST execution process.

The LBIST logic 600 with latch count comparator includes an LBIST and clock functional block 601 that includes the LBIST engine, clocking, and SSG support aspects described with regards FIG. 1.

A PRPG 602 provides a selected STUMP channel PRPG output that feeds weighted pseudo-random data to the corresponding selected stump chain 603, as described with regards to FIGS. 1 and 2. The selected stump chain 603 includes a full range 606 for a selection of an individual latch to be observed. An instance of the actively selected latch 607 is also provided. The switching activity of every latch in the range 606 is determined by executing the full LBIST test per selected latch as described herein.

The output of the selected stump chain 603 is input into logic 604, having an XOR gate and an AND gate configured and arranged as shown and being associated with each channel to enable selection and inversion as described herein. It should be appreciated that by selecting the inversion option, one can count the "0" instead of the "1" states of the selected latch.

An MISR 605 is also provided, which is similar to the MISR 111 of FIG. 1. However, in this example, the MISR 605 can be used as a special counter, rather than a signature generator, when the corresponding mode is selected.

The LBIST and clock functional block 601 sends a channel scan clock signal 608 to the selected stump chain 603. This is an LBIST engine generated channel scan and MISR clock signal. For each scan clock cycle, the STUMP chain shifts (concurrently load and unload) and the MISR 605 is closed concurrently capturing the selected channel output data. In some examples, such as a normal LBIST mode, the MISR 605 is clocked on each cycle to generate a signature.

The output 610 of the logic 604 feeds the input of the MISR 605 via AND gate 615.

An MISR input global mask 613 is an additional LBIST control line used to disable MISR input data via a global signal 614 into an AND gate 415. The AND gate 615 sets the inputs to the MISR 605 to "0" when 613 is asserted. This, in turn, has the effect of changing the MISR 605 into a simple LFSR. When using the LFSR as a special counter, the initial MISR state is set to a non-zero state.

The LBIST and clock functional block 601 also sends a MISR clock signal 609 to the MISR 605 via the MISR clock selector 620. The MISR clock signal 609 is similar to the channel scan clock signal 608 but is enabled only during the selected latch range or aperture.

The output 610 of the logic 604 also feeds an OR gate 611, which in turn feeds the latch 616, an XOR gate 617, and an AND gate 619. The function of the latch 616 is to save the previous state of the selected latch to be compared to the current state of the selected latch. These two states can then be used to determine a transition event. For example, if the previous and current state of the latch are different, then a latch state transition is determined to have occurred.

The XOR gate 617 receives an output from the latch 616 and the output of the OR gate 611 and outputs a logical "true" for a transition event, which is fed into an AND gate 618. The AND gate 618 enables the MISR clock signal 609 to propagate to the MISR mode selector 620 for a transition occurrence.

An AND gate 619 only allows the MISR clock 609 to propagate to the MISR 605 when the selected scan out data is a logical "1" for latch state counting as described in FIG. 3. The MISR mode selector 620 propagates the corresponding MISR clock 609 to increment the MISR 605 to the next state or count based on the MISR mode selection control signal 621. The MISR mode selection control signal 621 is a 2-bit signal set by the LBIST engine. The MISR mode of operation 622 is selected depending on the LBIST test being executed. The MISR modes of operation 622 can include a normal signature generation mode, a selected latch state counter mode (i.e., counting "1"s or "0"s), a selected latch transition counter mode (i.e., counting "1-to-0" transitions and "0-to-1" transitions) mode, and/or a counter compare mode.

The LBIST logic 600 includes a count compare register 623 that is pre-loaded with a calculated value to be compared to the MISR count from the MISR 605. Note that this value is a special count representing a desired MISR state to be compared. The special value from the count compare register 623 is compared to the MISR scan-out 412 at the comparator 624. This represent the output of the latch-count-comparator. The logic state of the output of the comparator 624 is "true" when the values from the MISR 605 and the count compare register 623 match. This signal is sent to the LBIST engine. Also, the comparator matching output is used by the LBIST engine (see arrow 625) to determine the tester loop matching the predefined count and to dynamically alter the execution flow.

Figure 7:
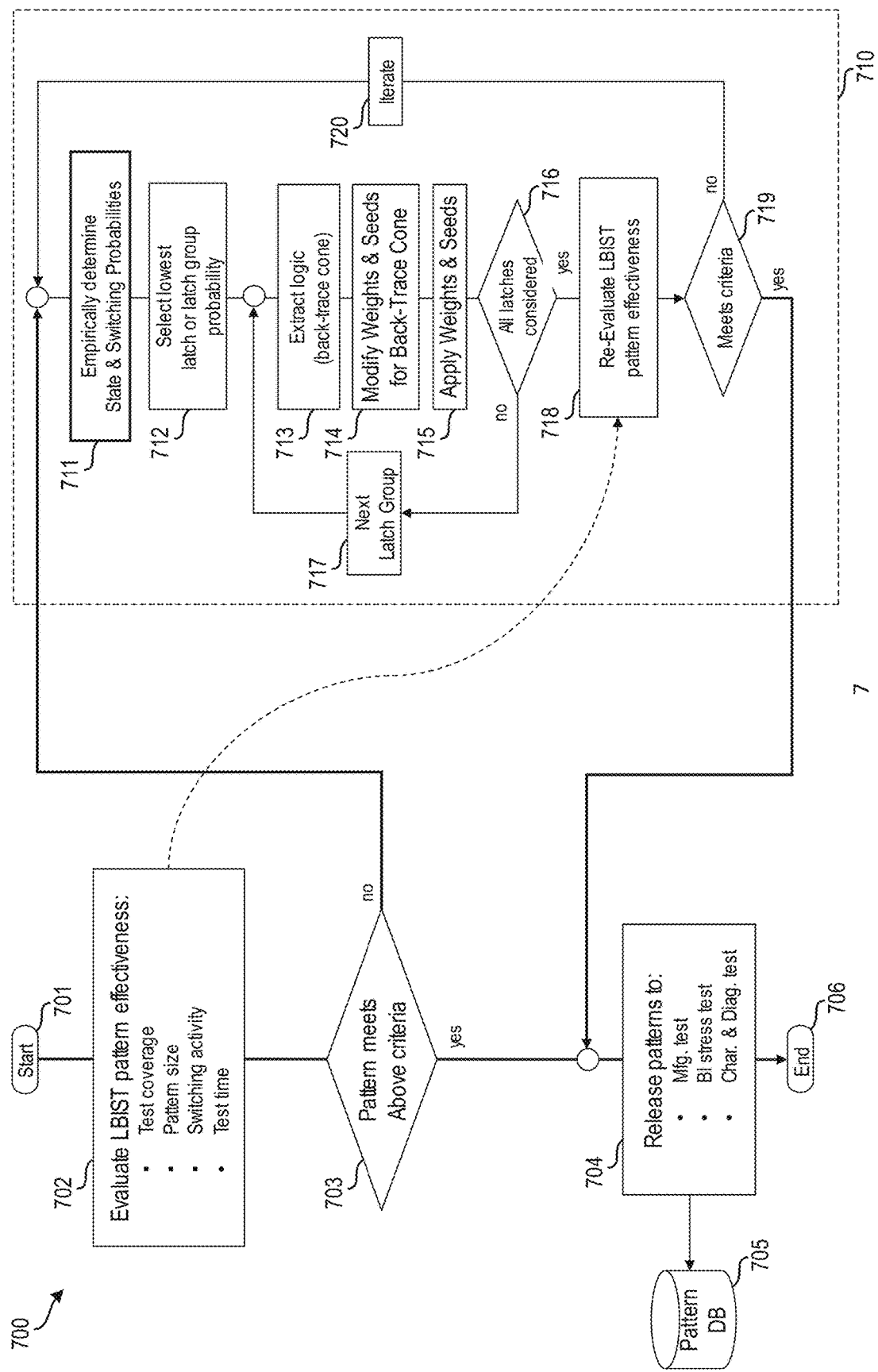
FIG. 7 depicts a flow diagram of a method for LBIST pattern evaluation according to one or more embodiments described herein.

FIG. 7 depicts a flow diagram of a method 700 for LBIST pattern evaluation according to one or more embodiments described herein. The method 700 starts at block 701 and continues to block 702 where an LBIST pattern effectiveness is evaluated. Pattern effectiveness is evaluated based on pattern factors such as test coverage, pattern size, switching activity, test time, and the like. At decision block 703, it is determined, based on the pattern factors of block 702, whether the pattern meets the criteria (i.e., the pattern factors). If so, the method 700 continues to block 704, and the pattern is released for further testing such as manufacturer tests, BI stress test, characterization and diagnostic tests, etc. In some examples, the pattern is stored in a pattern database 705. The method 700 then ends at block 706.

If, however, at decision block 703, it is determined that the pattern (based on the evaluation at block 702) does not meet the criteria of the evaluation, the pattern is modified and reevaluated at block 710. In particular, at block 711, state and switching probabilities are empirically determined as described herein. A lowest latch or latch group probability is selected at block 712. Logic from the lowest latch or latch group probability is extracted at block 713, which can be a back-trace cone. At block 714, weights and seeds for the back-trace cone are modified, and new weights and seeds are applied at block 715. It is then determined, at decision block 716, whether all latches have been considered. If not, the next latch group is evaluated at block 717. If, however, at decision block 716 it is determined that all latches have been considered, the LBIST pattern effectiveness is re-evaluated using the new weights at block 718. It is then determined, at decision block 719, whether the pattern meets the criteria set forth in the evaluation (see blocks 702, 718). If so, the pattern is released for further testing at block 704. However, if it is determined at decision block 719 that the criteria of the evaluation are not met, the modification and evaluation of block 710 is iterated at block 720.

According to one or more embodiments described herein, the implementation of an LBIST test exerciser (e.g., one or more of the LBIST logics 300, 400, 600) as described above depends on the test system capabilities and on the design-for-test support or built-in-self-test on the device under test.

A typical LBIST test may have many millions of tester cycles or tester-loops. A general LBIST tester-loop includes loading the STUMP chains, applying a system clock sequence and unloading the STUMP chains into the signature generating MISR. The loading and unloading of the STUMP chain are usually done simultaneously.

As an example of the approximate number of tester cycles required to determine the switching activity of all the latches in a STUMP structure (e.g., for a 32-chain×$10^3$ latches/chain×$10^6$ tester-loops×$10^3$ individual latch selection) would require ~32×$10^{12}$ cycles. For a test pattern execution of 133 MHz (or ~7.5 ns), the total test time would be ~2.7 days. This long test time could be performed on long over-night runs with minimal automated test equipment tester resources or need for software simulation system resources.

The modified process to reduce the above long test time may be to execute a shorter LBIST pattern (e.g. $10^3$ T/Ls) and exclude latches that have high switching activity from the next pass execution of LBIST with a higher number of tester loops. This process can then be repeated several iterations (see FIG. 5). Furthermore, execution parameter options allow for selective pattern, chain, and latch evaluation.

Similarly, the test time can also be reduced by checking the state of the MISR counter to terminate the specific pass when a predetermined state or switching counter criteria has been reached (not shown in FIG. 5).

Furthermore, multiple STUMP structures on the DUT can be run concurrently or simultaneously since the MISRs and STUMP channels are independent of each other. Similarly, the above concept can be also used to determine the switching activity of input or stimulating latches in addition to the output or observation latches. Of course, the latch switching activity is specific to the DUT's structure and logic design.

The use of the MISR as a 'special' counter differs from a classical binary up/down counter. This type of LFSR based counter state sequence is based on the feedback configuration (standard or modular), number of feedback taps, and input tap location. The LFSR feedback taps should be chosen to realize a maximal-length configuration (i.e., $2^n-1$), for example. Knowing these configuration parameters, the initial and final state of the MISR, and the input data to the MISR, the actual equivalent binary count can be determined.

The latch count comparator feature shown in FIG. 6 allows for dynamic comparison of the MISR state or count to a pre-defined value. This function can be used to determine the tester loop at which the MISR matches achieves the desired latch switching or state activity (e.g., the first time a latch switches state, etc.). Additionally, the execution flow can be optimized by skipping latch evaluation once the desired condition is met.

Note that the latch comparison function is implemented for each STUMP structure. For larger LBIST configurations with multiple STUMP structures and multiple MISRs, the comparison outputs can be logically combined or selected for each LBIST engine (not shown in FIG. 6)

Another approach to determine the equivalent binary count of the MISR is to use a simple MISR emulation subroutine to compare the state of the emulated MISR to the final state of the actual device under test MISR while incrementing the binary counter until a match to the final state is reached.

The embodiments shown in FIGS. 3, 4, and 6 represent three of many possible logic circuit implementation and are intended mainly to describe the basic concept.

According to one or more embodiments described herein, an LBIST exerciser such as a functional stand-alone system or an automated test environment test system for testing DUTs configured with one or more of the LBIST logics 300, 400, 600 can include the following capabilities: environmental controls, DUT alignment and contacting sub-system, power supply capacity, full digital I/O complement, clocks and I/O timing programmability, product test interface, and/or LBIST setup and MISR data acquisition. That is, the test system can be capable of setting LBIST test conditions and supporting the DUT's interactive built-in test execution requirements.

Similarly, some of the features of the DUT built-in test support can include: LBIST configuration and sequencing, selective signature support, and MISR special counter modifications.

Figure 8:
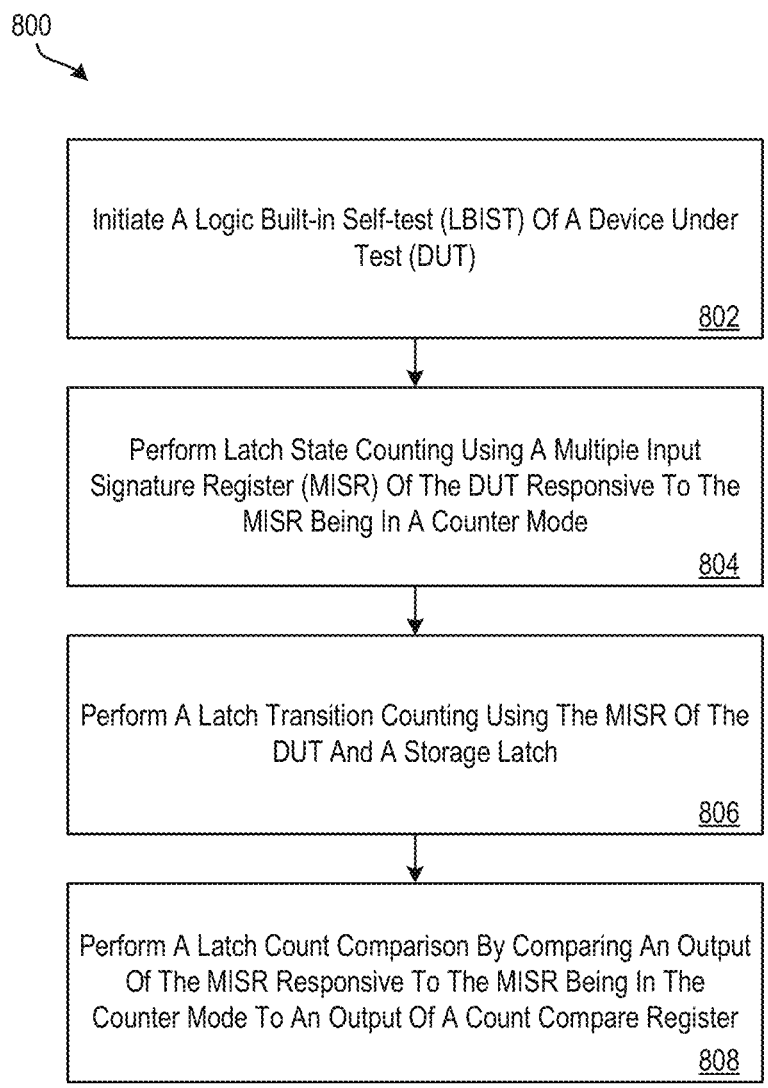
FIG. 8 depicts a method according to one or more embodiments described herein.

FIG. 8 depicts a flow diagram of a method 800 according to examples of the present disclosure. At block 802, the method 800 includes initiating a logic built-in self-test (LBIST) of a device under test (DUT). At block 804, the method 800 includes performing latch state counting using a multiple input signature register (MISR) of the DUT, the performing responsive to the MISR being in a counter mode (see FIG. 3). At block 806, the method 800 includes performing a latch transition counting of latches of the DUT using the MISR of the DUT and a storage latch, the performing responsive to the MISR being in the counter mode (see FIG. 4). At block 808, the method 800 includes performing a latch count comparison by comparing an output of the MISR responsive to the MISR being in the counter mode to an output of a count compare register, the output of the count compare register representing a desired MISR state (see FIG. 6).

Additional processes also may be included, and it should be understood that the process depicted in FIG. 8 represents an illustration, and that other processes may be added or existing processes may be removed, modified, or rearranged without departing from the scope of the present disclosure.

Figure 9:
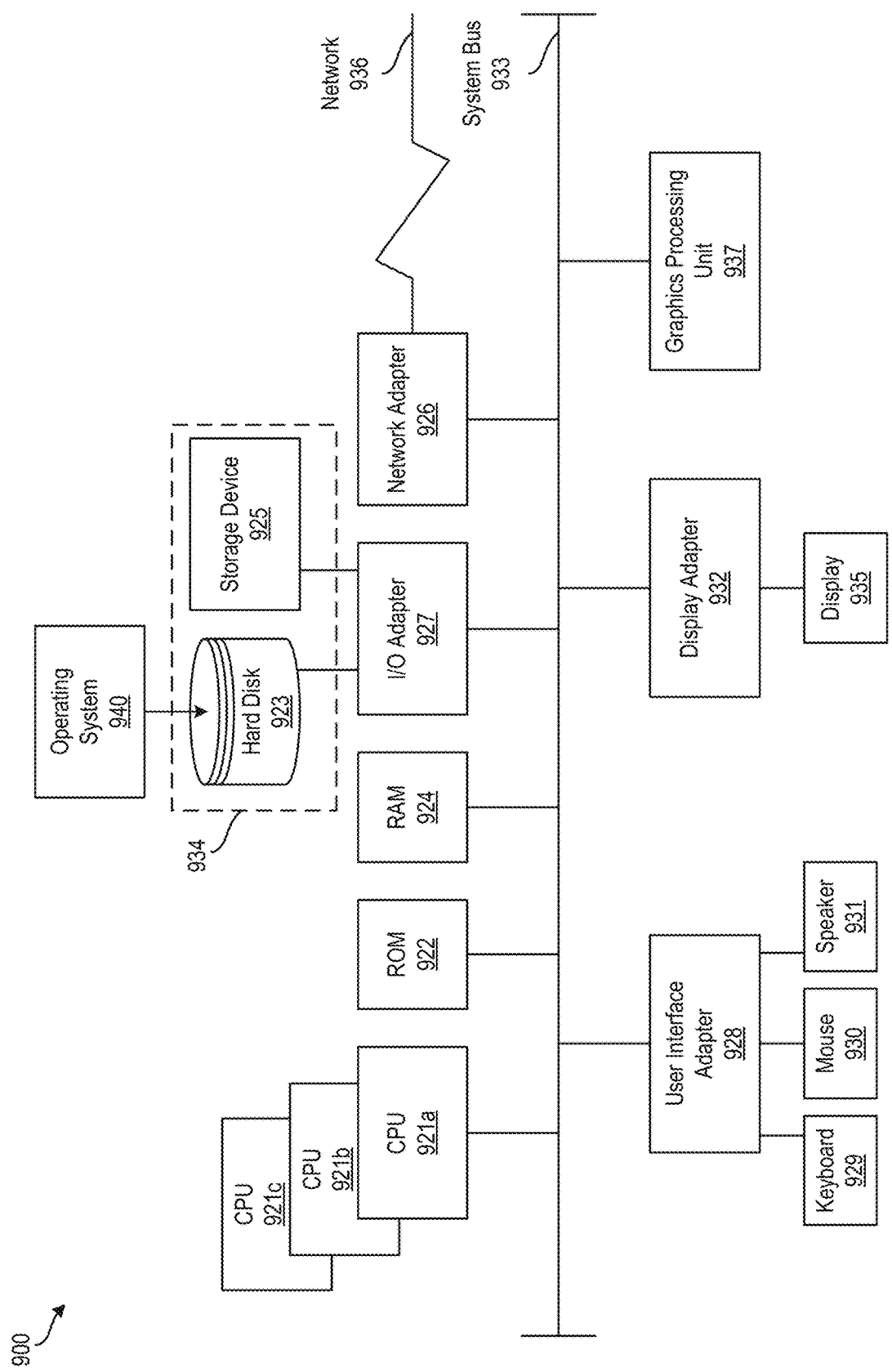
FIG. 9 depicts a block diagram of a processing system for implementing the presently described techniques according to one or more embodiments described herein.

It is understood that one or more embodiments described herein is capable of being implemented in conjunction with any other type of computing environment now known or later developed. For example, FIG. 9 depicts a block diagram of a processing system 900 for implementing the techniques described herein. In examples, processing system 900 has one or more central processing units ("processors" or "processing resources") 921a, 921b, 921c, etc. (collectively or generically referred to as processor(s) 921 and/or as processing device(s)). In aspects of the present disclosure, each processor 921 can include a reduced instruction set computer (RISC) microprocessor. Processors 921 are coupled to system memory (e.g., random access memory (RAM) 924) and various other components via a system bus 933. Read only memory (ROM) 922 is coupled to system bus 933 and may include a basic input/output system (BIOS), which controls certain basic functions of processing system 900.

Further depicted are an input/output (I/O) adapter 927 and a network adapter 926 coupled to system bus 933. I/O adapter 927 may be a small computer system interface (SCSI) adapter that communicates with a hard disk 923 and/or a storage device 925 or any other similar component. I/O adapter 927, hard disk 923, and storage device 925 are collectively referred to herein as mass storage 934. Operating system 940 for execution on processing system 900 may be stored in mass storage 934. The network adapter 926 interconnects system bus 933 with an outside network 936 enabling processing system 900 to communicate with other such systems.

A display (e.g., a display monitor) 935 is connected to system bus 933 by display adapter 932, which may include a graphics adapter to improve the performance of graphics intensive applications and a video controller. In one aspect of the present disclosure, adapters 926, 927, and/or 932 may be connected to one or more I/O busses that are connected to system bus 933 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 933 via user interface adapter 928 and display adapter 932. A keyboard 929, mouse 930, and speaker 931 may be interconnected to system bus 933 via user interface adapter 928, which may include, for example, a Super I/O chip integrating multiple device adapters into a single integrated circuit.

In some aspects of the present disclosure, processing system 900 includes a graphics processing unit 937. Graphics processing unit 937 is a specialized electronic circuit designed to manipulate and alter memory to accelerate the creation of images in a frame buffer intended for output to a display. In general, graphics processing unit 937 is very efficient at manipulating computer graphics and image processing, and has a highly parallel structure that makes it more effective than general-purpose CPUs for algorithms where processing of large blocks of data is done in parallel.

Thus, as configured herein, processing system 900 includes processing capability in the form of processors 921, storage capability including system memory (e.g., RAM 924), and mass storage 934, input means such as keyboard 929 and mouse 930, and output capability including speaker 931 and display 935. In some aspects of the present disclosure, a portion of system memory (e.g., RAM 924) and mass storage 934 collectively store the operating system 940 such as the AIX® operating system from IBM Corporation to coordinate the functions of the various components shown in processing system 900.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   initiating a logic built-in self-test (LBIST) of a device under test (DUT);
   performing latch state counting using a multiple input signature register (MISR) of the DUT, the performing responsive to the MISR being in a counter mode;
   performing a latch transition counting of latches of the DUT using the MISR of the DUT and a storage latch, the performing responsive to the MISR being in the counter mode; and
   performing a latch count comparison by comparing an output of the MISR responsive to the MISR being in the counter mode to an output of a count compare register, the output of the count compare register representing a desired MISR state.

2. The computer-implemented method of claim 1, further comprising:
   generating a signature by the MISR responsive to the MISR being in a signature mode.

3. The computer-implemented method of claim 2, wherein the MISR is in the counter mode or the signature mode based on a MISR clock signal from an LBIST engine.

4. The computer-implemented method of claim 1, further comprising:
   prior to performing the latch state counting, the latch transition counting, and the latch count comparison, selecting, using selective signature generation, individual latches in a self-test using MISR and parallel shift register sequence generation (SRSG) (STUMP) scan chains.

5. The computer-implemented method of claim 4, wherein the latch state counting, the latch transition counting, and the latch count comparison are performed on each of the individual latches iteratively.

6. The computer-implemented method of claim 1, wherein performing the latch transition counting is based at least in part on an MISR input global mask signal.

7. The computer-implemented method of claim 1, wherein the latch transition counting counts a number of logic transitions from "0" to "1" and a number of logic transitions from "1" to "0."

8. The computer-implemented method of claim 1, wherein the latch state counting counts a number of logic "0"s and a number of logic "1"s.

9. A computer-implemented method comprising:
   evaluating logic built-in self-test (LBIST) pattern effectiveness of an LBIST pattern based at least in part on one or more pattern factors;
   determining whether the LBIST pattern meets the one or more pattern factors;
   responsive to determining that the LBIST pattern meets the one or more pattern factors, releasing the LBIST pattern for further testing and storing the LBIST pattern in a pattern database; and
   responsive to determining that the LBIST pattern does not meet at least one of the one or more pattern factors, modifying the LBIST pattern and performing a reevaluation of the modified LBIST pattern.

10. The computer-implemented method of claim 9, wherein the one or more pattern factors is selected from the group consisting of a test coverage, a pattern size, a switching activity, and a test time.

11. The computer-implemented method of claim 9, wherein modifying the LBIST pattern comprises:
    selecting a lowest latch from a plurality of latches;
    extracting logic from the selected latch;
    modifying weights for a back-trace cone for the selected latch;
    applying the modified weights to the selected latch; and
    performing the reevaluation on the selected latch.

12. The computer-implemented method of claim 11, wherein modifying the LBIST pattern is iteratively performed on each latch of the plurality of latches starting with the lowest latch.

13. A system comprising:
    a memory comprising computer readable instructions; and
    a processing device for executing the computer readable instructions, the computer readable instructions controlling the processing device to perform operations comprising:
    initiating a logic built-in self-test (LBIST) of a device under test (DUT);
    performing latch state counting using a multiple input signature register (MISR) of the DUT, the performing responsive to the MISR being in a counter mode;
    performing a latch transition counting of latches of the DUT using the MISR of the DUT and a storage latch, the performing responsive to the MISR being in the counter mode; and
    performing a latch count comparison by comparing an output of the MISR responsive to the MISR being in the counter mode to an output of a count compare register, the output of the count compare register representing a desired MISR state.

14. The system of claim 13, wherein the operations further comprise:
    generating a signature by the MISR responsive to the MISR being in a signature mode.

15. The system of claim 14, wherein the MISR is in the counter mode or the signature mode based on a MISR clock signal from an LBIST engine.

16. The system of claim 13, wherein the operations further comprise:
    prior to performing the latch state counting, the latch transition counting, and the latch count comparison, selecting, using selective signature generation, individual latches in a self-test using MISR and parallel shift register sequence generation (SRSG) (STUMP) scan chains.

17. The system of claim 16, wherein the latch state counting, the latch transition counting, and the latch count comparison are performed on each of the individual latches iteratively.

18. The system of claim 13, wherein performing the latch transition counting is based at least in part on an MISR input global mask signal.

19. The system of claim 13, wherein the latch transition counting counts a number of logic transitions from "0" to "1" and a number of logic transitions from "1" to "0."

* * * * *